United States Patent [19]
Yuen

[11] Patent Number: 5,367,187
[45] Date of Patent: Nov. 22, 1994

[54] MASTER SLICE GATE ARRAY INTEGRATED CIRCUITS WITH BASIC CELLS ADAPTABLE FOR BOTH INPUT/OUTPUT AND LOGIC FUNCTIONS

[75] Inventor: Alex Yuen, Sunnyvale, Calif.

[73] Assignee: Quality Semiconductor, Inc., Santa Clara, Calif.

[21] Appl. No.: 995,224

[22] Filed: Dec. 22, 1992

[51] Int. Cl.⁵ .............................. H01L 27/02
[52] U.S. Cl. .................. 257/401; 257/202; 257/206
[58] Field of Search ............ 257/202, 203, 204, 206, 257/207, 208, 287, 338, 350, 358, 401, 390, 365

[56] References Cited

U.S. PATENT DOCUMENTS

| | | | |
|---|---|---|---|
| 4,533,935 | 8/1985 | Mochizuki | 257/379 |
| 4,766,475 | 8/1988 | Kawashima | 257/203 |
| 4,825,107 | 4/1989 | Naganuma et al. | 307/465 |
| 4,839,710 | 6/1989 | Holzapfel et al. | 357/45 |
| 4,864,381 | 9/1989 | Seefeldt et al. | 357/45 |
| 5,038,192 | 8/1991 | Bonneau et al. | 257/206 |
| 5,164,811 | 11/1992 | Tamura | 257/206 |

Primary Examiner—Robert Limanek
Assistant Examiner—David B. Hardy
Attorney, Agent, or Firm—Wilson, Sonsini, Goodrich & Rosati

[57] ABSTRACT

The input/output circuit cells of a master-slice gate array device have the same diffusion and gate regions as the basic transistors so that the input/output of the device may be defined at the metallization stage rather than at the time the diffusion regions are formed. Thus a single size master-slice circuit device need to be kept in inventory. The array size is selected in accordance with the customer's specification and the inputs/outputs are defined accordingly using CAD. Thereafter, the die may be scribed into smaller. The transistors for sea-of-gate structures containing a pair of long channel transistors whose drain, gate and source regions lie on a single grid or track of the CAD design tool. By using a long channel transistor in the feedback loop of a memory cell, gating transistors may be eliminated to reduce transistors required for latches. To provide the required drive capability, a number of transistors may be connected to form the input or output buffer, without requiring large transistors with large diffusion regions. A metal silicide resistor and a number of discharge transistors normally in the off condition are connected to the node between an input/output pad and input/output buffer for electrostatic discharge.

23 Claims, 10 Drawing Sheets

FIG.—1

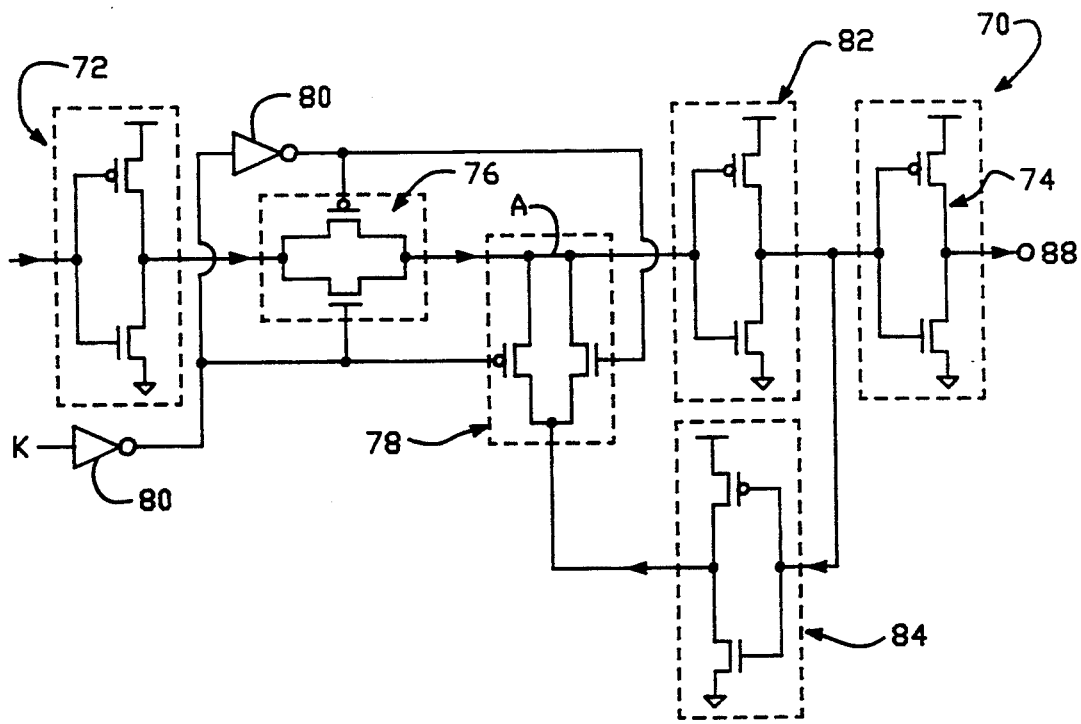
FIG.−3
(PRIOR ART)
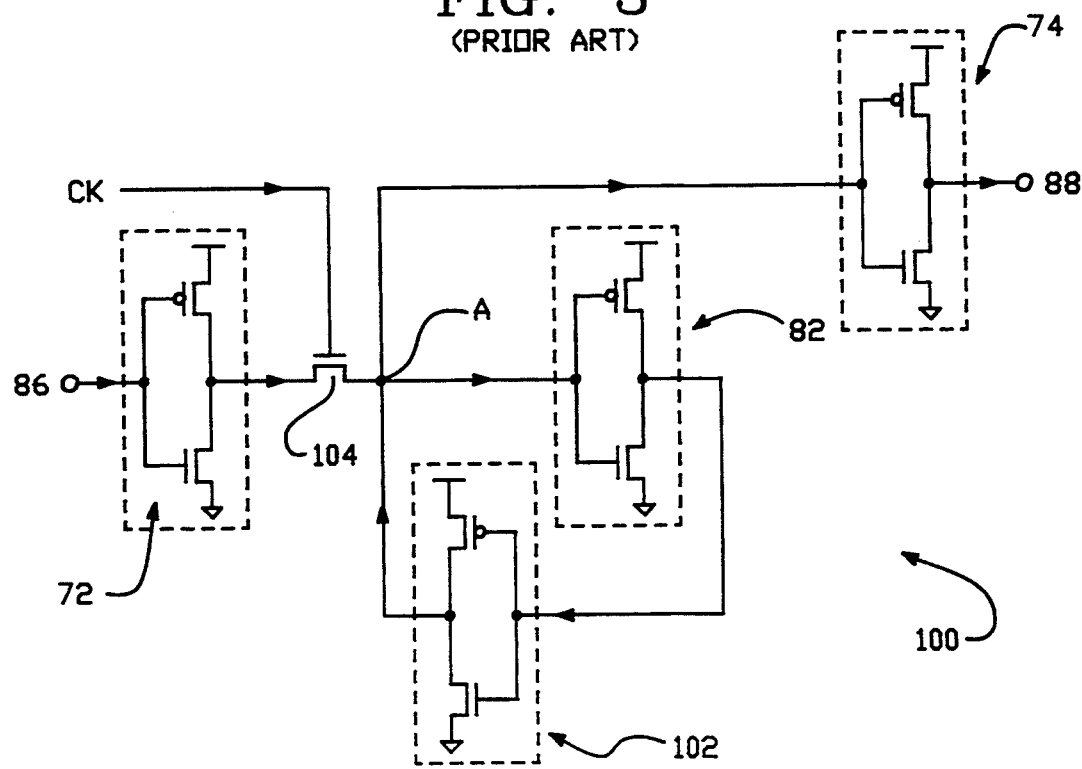
FIG.−4A

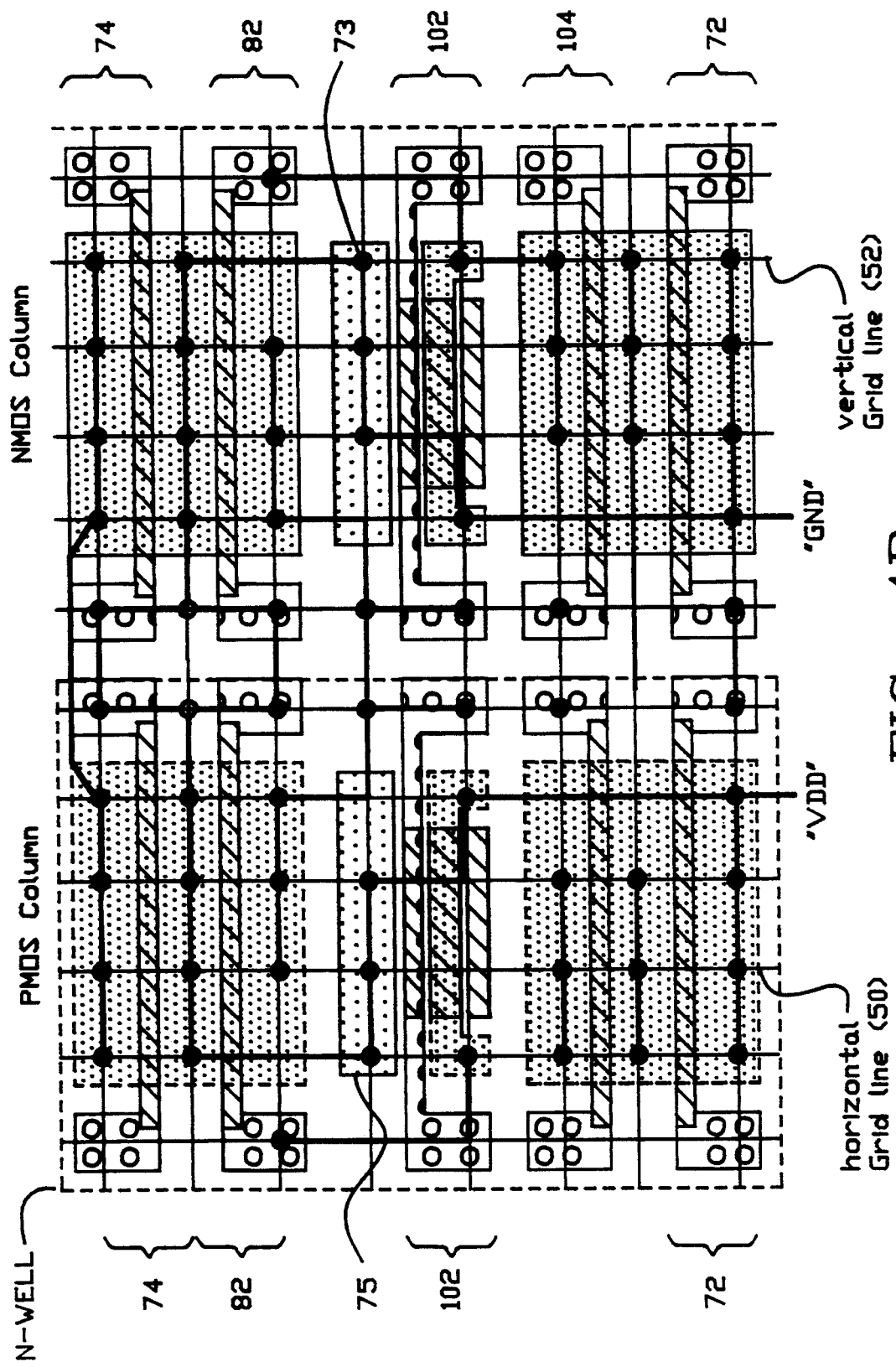
FIG.—4B

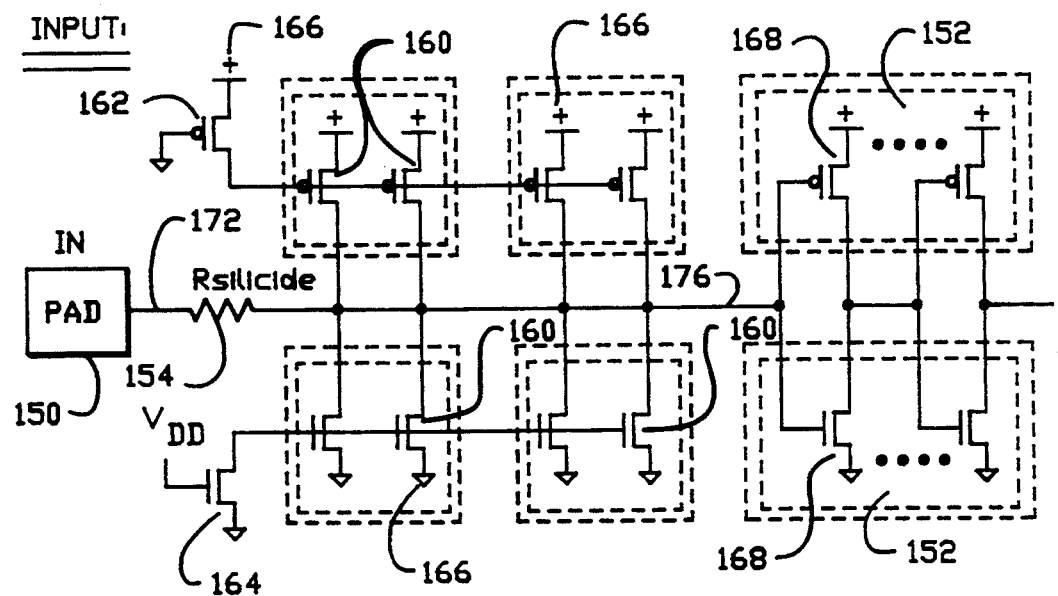
FIG.—5A
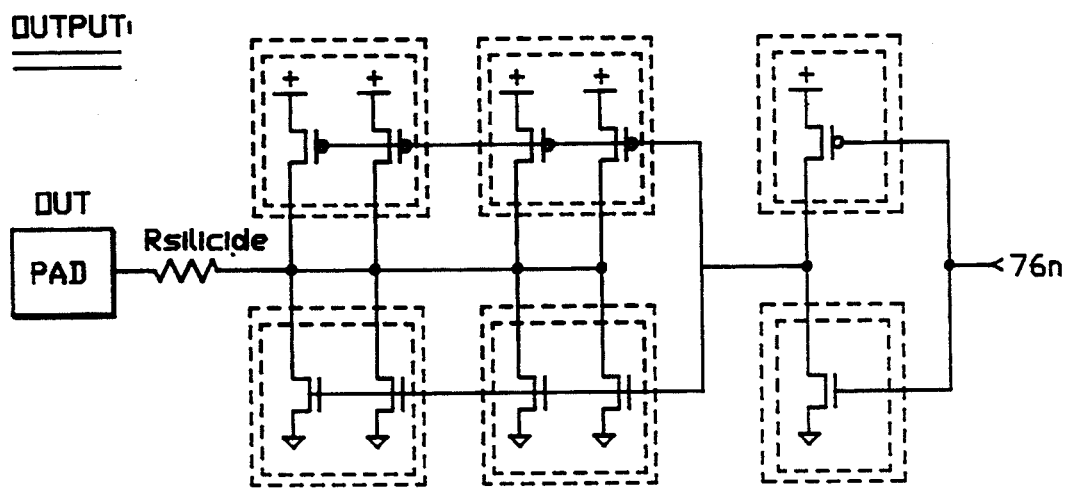
FIG.—6

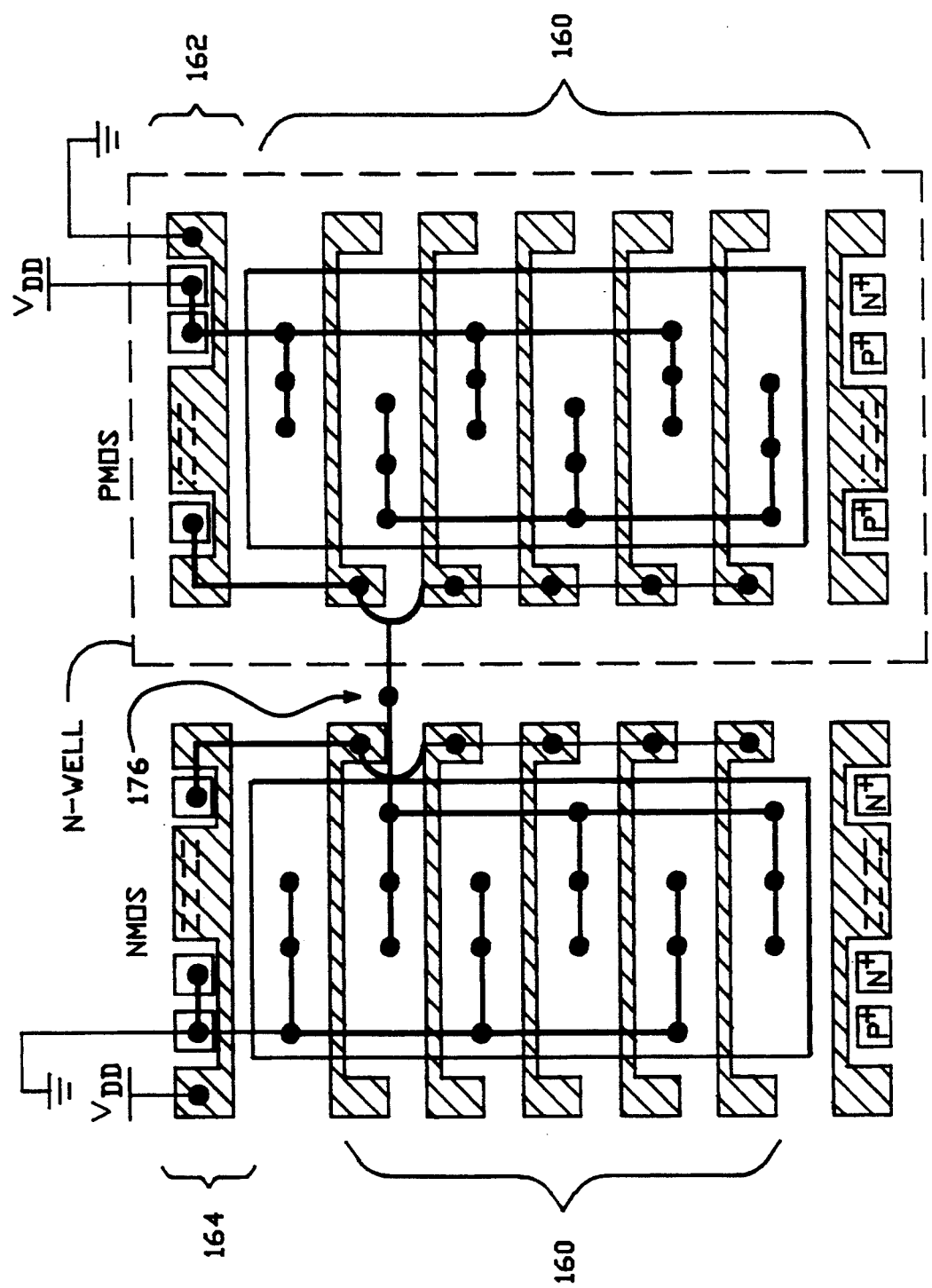
FIG.—5B

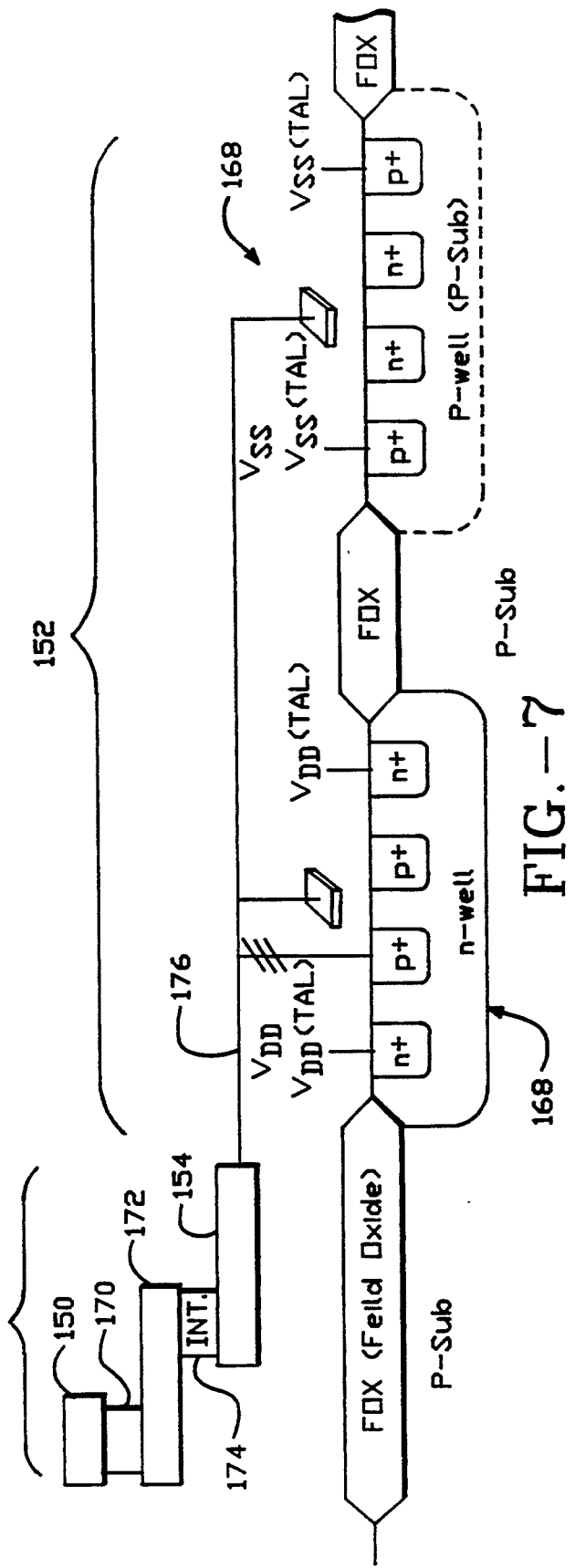
FIG.–5C
FIG.–5D
FIG.–7

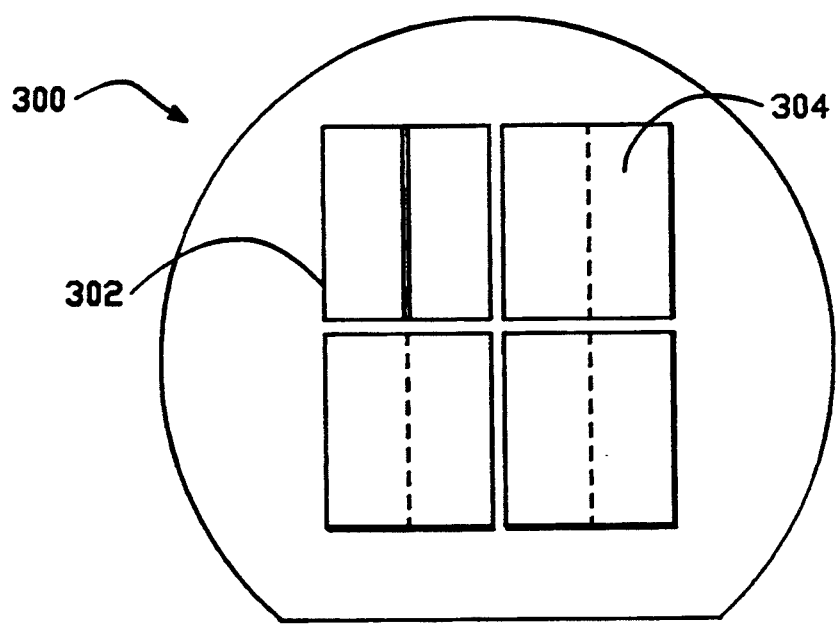
METAL PARTITION −1
FIG.−8
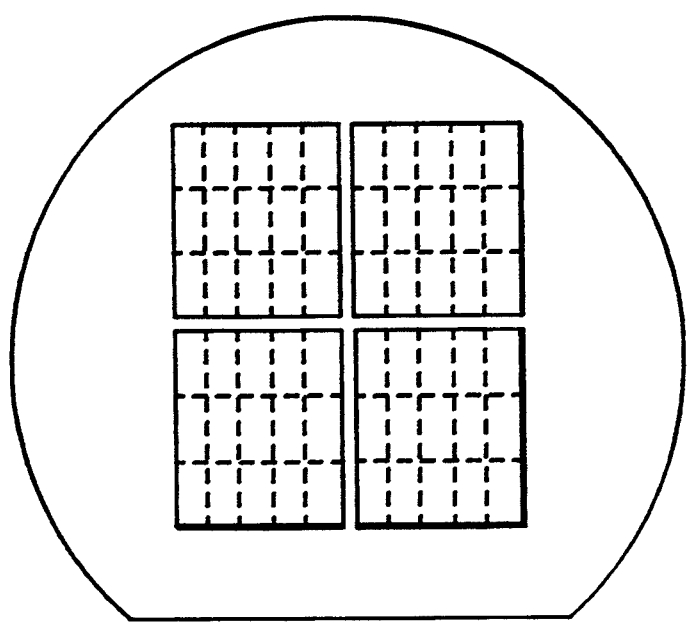
METAL PARTITION −2
FIG.−9

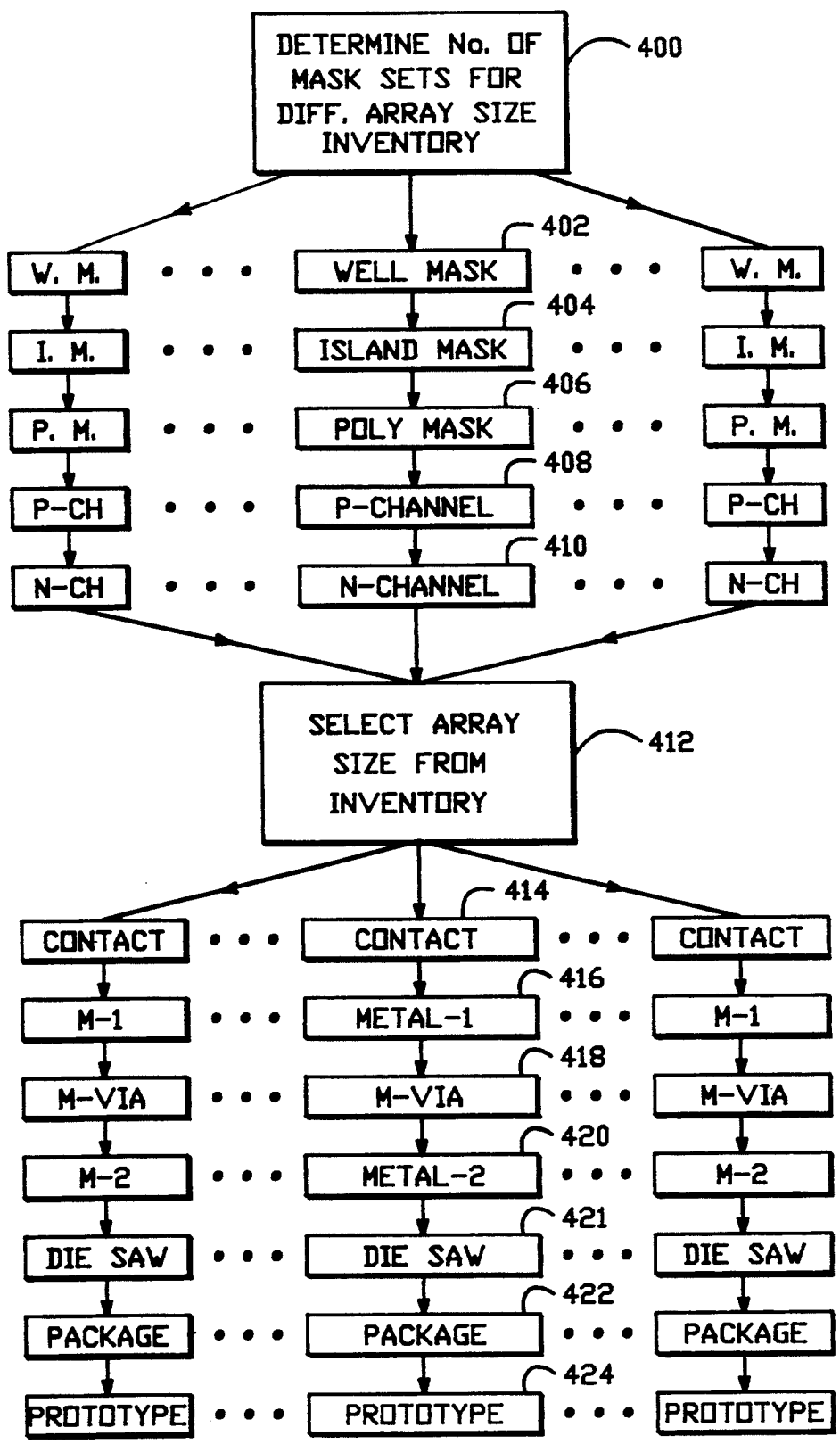
FIG.−10
(PRIOR ART)

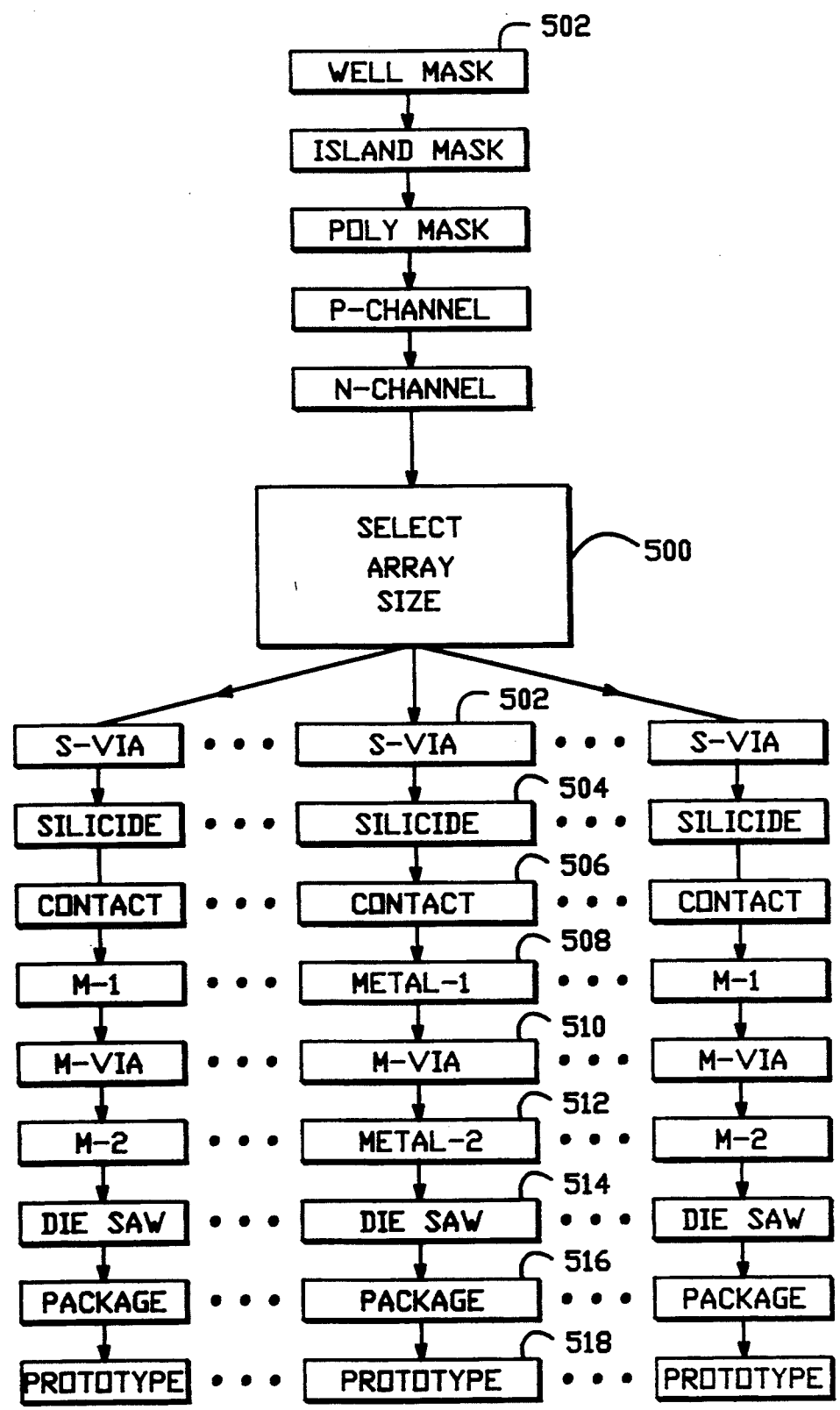
FIG.—11

MASTER SLICE GATE ARRAY INTEGRATED CIRCUITS WITH BASIC CELLS ADAPTABLE FOR BOTH INPUT/OUTPUT AND LOGIC FUNCTIONS

BACKGROUND OF THE INVENTION

This invention relates in general to integrated circuits and, in particular, to a master-slice gate array integrated circuit device and method for fabricating the device.

In the semiconductor industry, a number of different design approaches have been used in the design and manufacture of integrated circuits. Two such approaches are custom logic and semi-custom logic. Custom logic typically requires expensive custom design to provide a made-to-order integrated circuit for specific functions. Even though custom integrated circuits are costly to design, they may be cost effective for large quantity production.

For devices which are to be produced in small or moderate quantities, semi-custom integrated circuits may be more cost effective. Semi-custom logic includes programmable array logic (PAL) where the "programming" is performed after the fabrication of the device has been completed, such as by blowing fuses using lasers. PAL type circuits, however, are typically limited in the number of gate counts that can be included. For integrated circuits requiring a large number of gates, master-slice gate array circuits are frequently used.

A typical conventional master-slice integrated circuit includes a core logic area surrounded by input/output border cells arranged along the periphery of the circuit. The core logic area ordinarily includes a matrix of basic cells. The input/output border cells often include transistors larger in size than the basic cells in the core logic so that these larger transistors may be used to construct input or output buffers that can provide a higher drive capability.

One conventional method for fabricating the above-described master-slice type integrated circuit is as follows. First, the diffusion regions of the basic cells and of the larger input/output transistor cells are defined and mask sets are designed for fabricating these diffusion regions as well as a polysilicon layer to form the gates of the transistors. A master-slice type integrated circuit so formed then can be used to construct desired logic circuits in accordance with customer specifications by interconnecting the basic cells and input/output cells using conductive interconnect layers composed of materials such as metal silicide or metal. The input/output cells are hereinafter simply referred to as "I/O cells." Thus, depending on the specific application intended by the user, different interconnections between the transistors of the core logic regions and the I/O border cells are made during later production. The complete circuit chip then is enclosed within a package.

The logic circuits requested by customers may include a wide range of different gate counts. To accommodate such a wide range of different gate counts, an application specific integrated circuit (ASIC) manufacturer would typically have to store an inventory of gate array architectures of different sizes, each of which has a respective capacity sufficient to accommodate up to some maximum number of gate cells. Thus, to efficiently map a completed circuit design into an integrated circuit architecture, the circuit designer would select, from an inventory of pre-established gate array die sizes (e.g., 1K, 2.5K, 5K, 7.5K, 10K and 20K gate cell arrays), the die size is selected such that it includes at least the number of gates required for a completed circuit design.

It should be noted that while reference to gates in a master slice array is common parlance, the more accurate characterization would be transistors in a master slice array. The transistors can be interconnected to form gates such as inverter gates or nano gates. However, prior to such interconnection, the array merely comprises a plurality of unconnected transistors which have not yet been connected to form gates.

Maintaining an inventory of fixed die sizes can be cumbersome and costly. First, the inventory requires significant manufacturing overhead, since each die size is in effect a custom architecture requiring its own dedicated mask set. Furthermore, because in certain array architectures the I/O cells are distributed around the periphery of the chip, the number of I/O cells that the die may contain is limited by the size of the die. Namely, circuit designs requiring a large number of I/O devices may be realized through the use of large sized die, while considerable portions of the core logic cell are of the large die may go unused. It is therefore desirable to provide a different master-slice type integrated circuit and system whereby the above-described disadvantages are avoided.

In U.S. Pat. No. 4,864,381 to Seefeldt et al., a variable die size gate array architecture is disclosed where, instead of placing the I/O cells at the periphery of the chip, such I/O cells are intermingled with the basic logic cells in the core logic area. The I/O cells differ from the basic logic cells in that each I/O cell includes a number of I/O driver circuits and associated terminal pads. A problem with the architecture disclosed by Seefeldt et at. is that, where a large number of I/O cells are not required for a customer's design, a significant portion of the chip area would remain unused. Since such I/O cells may include a number of I/O driver circuits and associated terminal pads, the percentage of unused chip area can be quite high, which is wasteful of resources. It is therefore desirable to provide an improved gate array architecture which does not include unnecessary I/O cells.

For master-slice gate arrays in CMOS technology, it is sometimes desirable for such gate arrays to provide surface space saving resistors. For example, resistors may be used in delay elements. Sometimes it is also desirable for the gate arrays to provide capacitors of a surface space saving design, for example, for constructing dynamic storage cells and delay elements. If the basic transistor cells in the core logic area are used to construct the capacitors and resistors, it may be necessary to use a relatively large number of the basic cells to provide resistors of high ohmic value and capacitors of high capacitance. It is therefore desirable to provide master-slice gate array circuits where such disadvantage is alleviated.

In U.S. Pat. No. 4,839,710 to Holzapfel et al., special cells are included in a gate array having long channel transistors which can be used to provide relatively large resistance and capacitance in the array. The special cells disclosed by Holzapfel et al., however, have channels which are bent or circuitous in shape and, therefore, occupy relatively larger regions. Such special cells require larger chip areas and can be somewhat difficult to produce using certain customary computer-aided design type techniques. There is a need for a basic cell which uses a long channel transistor that occupies relatively little space and is well suited to computer aided design techniques.

SUMMARY OF THE INVENTION

In one aspect the invention provides a master-slice gate array integrated circuit comprising an array of basic cells in which the same basic cell structure is repeated substantially throughout the entire array.

In another aspect the invention provides a novel basic cell architecture. Each basic cell comprises multiple wide channel transistors and at least one long channel transistor. In a present embodiment the wide channel length is less than the wide channel width, and the long channel length is at least four times greater than the long channel width. In a present embodiment, the basic transistors are aligned on grid lines used by a computer-aided design tool, and the long channel transistor is aligned along a single routing grid line.

In still another aspect the invention is directed to a method for fabricating integrated circuits. The method comprises forming diffusion regions in the semiconductor wafer and forming a first layer over the wafer so that the first layer and the diffusion regions form an array of transistors in basic cells. The transistors each includes diffusion and gate regions in or on the wafer where the diffusion and gate regions of the transistors are substantially the same. The method further comprises determining the size of one or more integrated circuits to be formed, selecting some of the transistors to be input/output transistors, and forming a conductive second layer over the first layer to interconnect the transistors for forming the circuits and to define inputs and outputs of the circuits. The wafer may then be scribed into dice containing the circuits.

BRIEF DESCRIPTION OF THE DRAWINGS

FIG. 3 is a circuit diagram of a conventional latch,

FIG. 4A is a schematic diagram of a latch memory circuit implemented using a basic cell in accordance with the present invention, FIG. 4B is a layout plot showing the interconnection of long channel transistors and wide channel transistors of a basic cell in accordance with the present invention to implement the circuit of FIG. 4A.

FIG. 5A is a circuit diagram of an input circuit implemented using a basic cell in accordance with the present invention.

FIG. 5B is a layout plot showing the interconnection of long channel transistors and wide channel transistors of a basic cell in accordance with the present invention to implement the circuit of FIG. 5A.

FIG. 5 shows an illustrative diode used to represent the discharge action of the parallel connected NMOS transistors of FIGS. 5A and 5B.

FIG. 5D shows an illustrative diode used to represent the discharge action of the parallel connected PMOS transistors of FIGS. 5A and 5B.

FIG. 6 is a circuit diagram of an output circuit implemented using the gate array structure of the present invention and of an electrostatic discharge path to illustrate the preferred embodiment of the invention.

FIG. 7 is partly schematic and partly cross-sectional view of a semiconductor structure implemented using the gate array structures of this invention to illustrate an electrostatic discharge path.

FIGS. 8 and 9 are schematic diagrams of semiconductor wafers illustrating the locations of metal input output partition layers, and illustrating how the wafer may be subdivided into different chosen sizes.

FIG. 10 is a flow chart illustrating a conventional method of fabrication of gate array integrated circuits.

FIG. 11 is a flow chart illustrating a method of fabrication of gate array integrated circuits to illustrate the preferred embodiment of this invention.

To simplify the discussion, identical components in the different figures of this application are identified by the same numerals.

DETAILED DESCRIPTION OF THE PREFERRED EMBODIMENTS

The present invention comprises a novel master-slice gate array integrated circuit device with a novel basic cell for use in such an array and an associated method of fabrication. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
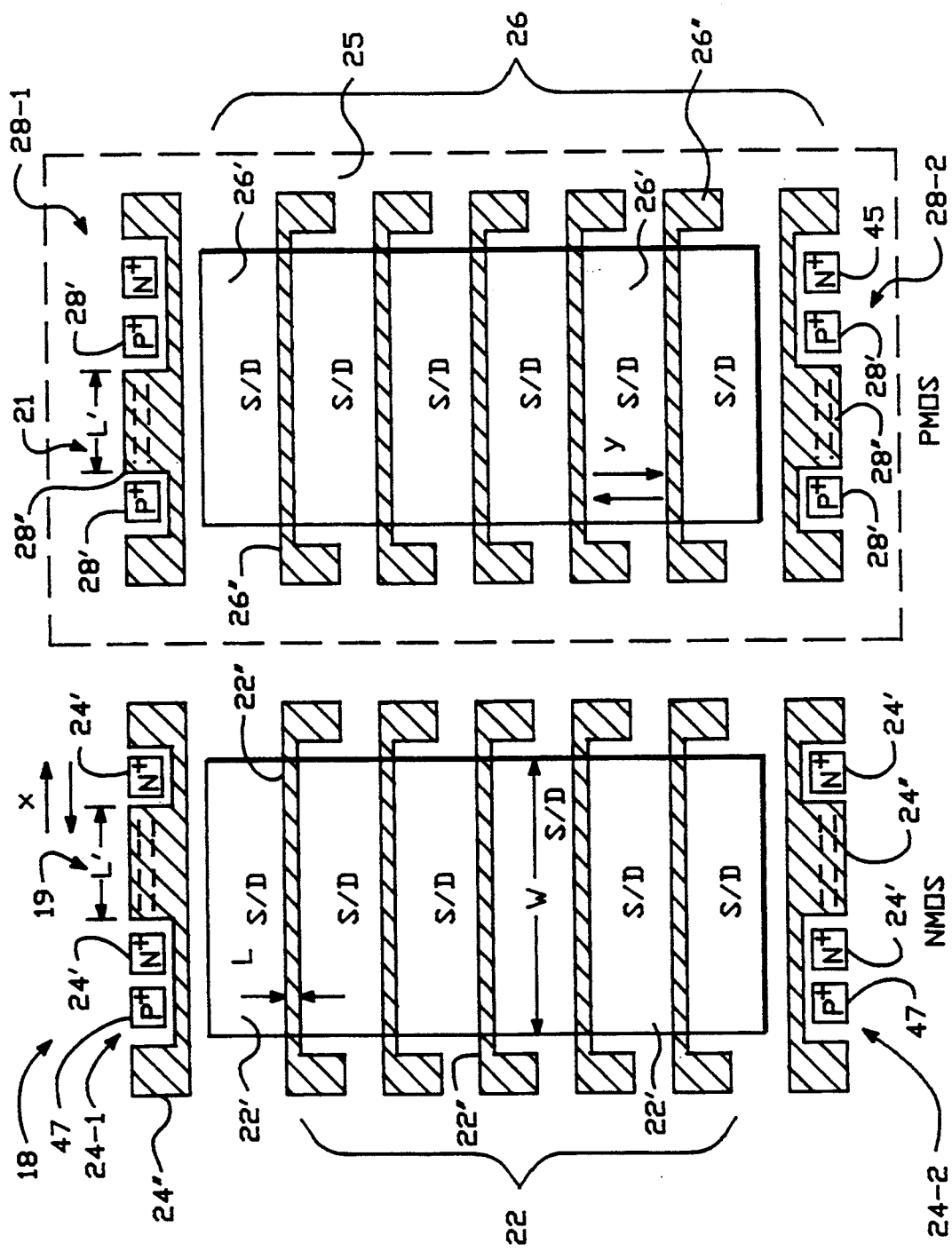
FIG. 1 is a top plan view of the layout of the transistors in a basic cell in accordance with the present invention.

Referring to the illustrative drawings of FIG. 1, there is shown a basic cell 18 in accordance with the present invention. The basic cell includes a collection of NMOS transistors 19 and a collection of PMOS transistors 21. The collection of NMOS transistors 19 includes both NMOS long channel transistors 24-1 and 24-2 and NMOS wide channel transistors 22. The collection of PMOS transistors 21 includes both PMOS long channel transistors 28-1 and 28-2 and PMOS wide channel transistors 26.

The respective collections of NMOS and PMOS transistors 19 and 21 can be connected together to form CMOS circuits. Significantly, the transistors of the basic cell 18 can be connected to form either CMOS logic circuits or input/output (I/O) circuits. Thus, a gate array (more accurately, a transistor array) using a basic cell in accordance with the present invention does not need to use specialized I/O cells: the same basic cell can be connected to serve as either a logic circuit or as an I/O circuit. Furthermore, a basic cell anywhere in the gate array can be connected to serve as an I/O cell: I/O cells do not have to be positioned at the periphery of the array or at any other predetermined location in the array.

More specifically, the basic cell 18 includes five NMOS wide channel transistors 22, two NMOS long channel transistors 24-1 and 24-2, five PMOS wide channel transistors 26, and two PMOS long channel transistors 28-1 and 28-2. Each NMOS wide channel transistor 22 includes source/drain (S/D) diffusion regions 22' and a gate 22A. Similarly, each PMOS transistor wide channel transistor 26 includes source/drain diffusion regions 26' and a gate 26".

Each of the two NMOS long channel transistors 24-1 and 24-2 includes N+ source/drain regions 24' and a gate 24". Likewise, each of the two PMOS long channel transistors 28-1 and 28-2 includes P+ source/drain regions 28' and a gate 28".

Transistors 22 and 26 are wide channel transistors, where a wide channel transistor is defined as a transistor whose channel length is less than its channel width. The width W of transistors 22, 26 is greater than the transistor length L. Wide transistor length L is the same as the width of the narrow portion of gates 22" 26". Transistors 24-1, 24-2, 28-1 and 28-2, on the other hand, are long channel transistors whose channel length L' is at least four times the transistor channel width W'.

Respective P+ guard regions 47 are formed adjacent to the collection of NMOS transistors 19. Respective N+ guard regions 45 are formed adjacent to the collection of PMOS transistors 21.

In the present embodiment, the basic cell 18 is formed in a P-type substrate. The collection of PMOS transistors 21 is formed in an N-well 25 (within the dashed lines). The respective P-type source/drain diffusion regions 26' are formed on opposite sides of respective gates 26". The respective N-type source/drain diffusions regions 22' are formed on opposite sides of respective gates 22". The respective P+ source/drain regions 28' are formed on opposite sides of the respective gates 28". The PMOS long transistor channel is indicated by dashed lines between the source/drains 28'. The respective N+ source/drain diffusion regions 24' are formed on opposite sides of respective gates 24". The NMOS long transistor channel is indicated by dashed lines between the source/drains 24'.

The direction of current flow in the wide channel transistors 22 and 26 is in the vertical direction in FIG. 1 as indicated by the arrows labelled "y". The direction of current flow in the long channel transistors 24-1, 24-2, 28-1 and 28-2 is in the horizontal direction in FIG. 1 as indicated by the arrows labelled "x".

Figure 2:
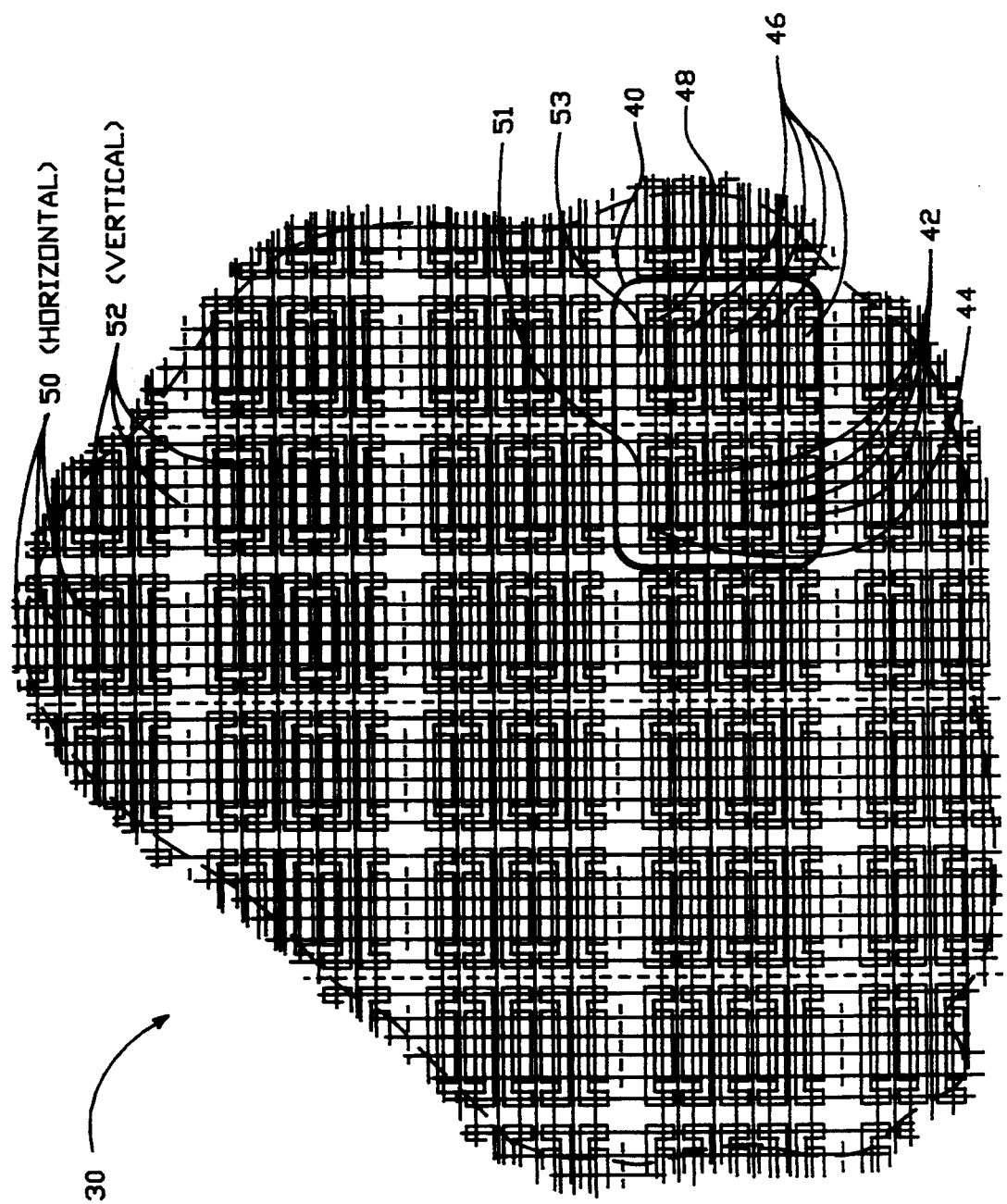
FIG. 2 is a top plan view of a portion of a multiplicity of basic cells in accordance with an alternate basic cell embodiment of the invention.

FIG. 2 is an illustrative top plan view of a portion of a semiconductor die or chip which includes a plurality of alternative basic cells 40 in accordance with the principles of the invention. As shown in FIG. 2, chip 30 includes a repetitive pattern of basic cells 40 each of which comprises four NMOS wide channel transistors 42, one NMOS long channel transistor 44, four PMOS wide channel transistors 46, and one PMOS long channel transistor 48, for a total of ten transistors in each basic cell 40.

The structures and operation of the respective wide and long channel transistors of each basic cell 40 of FIG. 2 are similar to those of corresponding wide and long channel transistors of the basic cell 18 of FIG. 1. Specifically, each NMOS wide channel transistor 42 includes respective wide transistor N+ source/drain regions formed on opposite sides of respective wide transistor polysilicon gates, and each PMOS wide channel transistor 46 includes respective similar P+ source/drain regions formed on opposite sides of respective similar polysilicon gates. Also, each NMOS long channel transistor 44 includes N+ long transistor source/drain regions formed on opposite sides of respective long transistor polysilicon gate, and each PMOS long channel transistor 48 includes similar P+ source/drain regions formed on opposite sides of a respective similar polysilicon gate.

Moreover, the basic cell 18 of FIG. 1 is meant to be merely representative of a multiplicity of such basic cells formed on a semiconductor chip similar to that of FIG. 2. A multiplicity of basic cells such as that shown in FIG. 2 often is referred to as a "sea of gates" (or sea of transistors).

The sea of gates of FIG. 2 comprises columns of NMOS transistors and columns of PMOS transistors. Each basic cell 40 includes a collection of five PMOS transistors from a PMOS transistor column and includes a collection of five NMOS transistors from an adjacent NMOS transistor column. Each respective five transistor PMOS collection is separated from its immediately adjacent five transistor PMOS collection by a respective N+ guard region 51. Similarly, each respective five transistor NMOS collection is separated from its immediately adjacent five transistor NMOS collection by a respective P+ guard region 53. The respective guard regions 51 and 53 serve to isolate adjacent collections of transistors and help to prevent latch-up. The chip 30 is comprises a P-type substrate. Thus, the PMOS transistors are formed in an N-well.

The die 30, therefore, provides a multiplicity of basic cells 40, prior to the addition of any interconnect layers which serve to define actual circuits and gates for use in particular customer applications. It should be noted that all of the basic cells are essentially identical. There are no cells specially slated to become logic cells or I/O cells. Also, there is no particular region reserved as the location for logic cells or for I/O cells.

As is known to those skilled in the art, computer-aided design (CAD) tools can be used to place and route conductive interconnect layers such as metal or a metal silicide layer and to form vias and metal contacts from these conductive layers to the source/drain diffusion regions and to the transistor gates. In a commonly used place and route system in CAD, sets of routing grid or track lines are used, such as the two sets 50 (horizontal) and 52 (vertical) shown in FIG. 2. The grid (or track) lines within each set are parallel to each other but are perpendicular to those of the other set. The grid lines within each set are spaced at equal distances so that the intersections of the two sets of lines form a grid pattern superimposed onto die 30.

The grid lines form a coordinate system used by the CAD system in placing and routing interconnect lines. In each source/drain region of each wide channel transistor of each basic cell 40, there are four intersections between horizontal and vertical grid lines 50 and 52. In each source/drain region of each long transistor of each basic cell 40, there is only a single intersection of horizontal and vertical grid lines 50 and 52. Moreover, for each respective wide channel transistor, there is one such intersection for each of the two ends of each respective wide transistor gate. Similarly, for each respective long channel transistor, there is one such intersection for each of the two ends of each respective long transistor gate. Each intersection between the two sets of grid lines 50, 52 represents a location where a via or contact may be formed for a conductive layer to contact either a source/drain diffusion region or a gate region. As explained and illustrated below, horizontal and vertical grid lines 50 and 52 also intersect in the guard regions, and conductive contact can be made there as well.

From FIGS. 1 and 2, it will be appreciated that the respective long dimensions of the respective long transistors are oriented along respective horizontal grid lines 50. The respective two source/drain regions and the gate of each respective long transistor lies on a respective single grid line. In fact, the PMOS and MOS long transistors 44 and 48 of the basic cell 40 are adjacent to each other and are aligned along the same grid line. Thus, a single respective grid line 50 can be used for routing conductors to multiple long transistors oriented along that grid line 50.

FIG. 2, therefore, illustrates an important aspect of the invention. The basic cell 40 is repeated throughout the extent of semiconductor die or chip 30. In contrast with many conventional gate array architectures, there is no differentiation between I/O cells and logic cells, and the same basic cells 40 are present throughout the chip 30, both at the chip periphery and in the chip interior region. To construct the I/O driver circuit, a designer would use CAD tools to lay down conductive layers for interconnecting one or more basic cells 40 in a desired combination (e.g., transistors connected in parallel) in order to provide the desired drive capability. Since there are no basic cells dedicated to be logic cells or dedicated to be I/O cells, and since there are no special regions of the die 30 reserved for logic cells or for I/O cells, different chip architectures are not required for different sized die. For example, if a given die happens to have a basic cell count greater than that called for in a customer product, then those die may be scribed into smaller die of an appropriate size, thereby avoiding wasteful use of the die.

FIG. 3 is a schematic circuit diagram of an earlier conventional latch circuit which can be produced from a conventional gate array architecture. Latch circuit 70 includes an input buffer 72, an output buffer 74, transmission gates 76 and 78 controlled by clock signal CK through inverters 80, and the memory cell formed by the two inverters 82 and 84 arranged in a feedback loop controlled by transmission gates 76 and 78. Assume that a logic "1" is stored in the memory cell so that node A is at logic high initially. When it is desirable to change the logic state stored by latch 70, the clock signal CK is pulled low so that it turns on transmission gate 76 and turns off transmission gate 78. This permits the input signal "1" at node 86 through inverting buffer 72 to reach the inverter 82 to change the logic state "1" stored by inverters 82, 84 to logic state "0." Since the original state stored by the pair of inverters is a "1" the output of inverter 82 is low initially so that the output of inverter 84 is high. But since transmission gate 78 is turned off by the clock signal CK, the feedback action of inverter 84 is blocked by the transmission gate 78 so that the input signal originating at input node 86 is permitted to change the state stored in the latch. Therefore, the output of inverter 82 is forced high which in turn forces the output of inverter 84 low. After this is accomplished, the clock signal CK rises, thereby turning off transmission gate 76 and turning on transmission gate 78. This permits the feedback action of inverter 84 in the feedback loop to maintain the input of inverter 82 in a "0" logic state. The output of the memory cell is passed to the output node 88 through output buffer 74.

If transmission gate 78 was not present, then the buffer 72 driving the input signal from input node 86 to node A, would have to overcome the feedback action of inverter 84 in order to change the state of the memory cell at node A. In latches implemented using certain conventional gate array architectures, the transistors in a core logic area have essentially the same width and length. For this reason, transmission gates 76 and 78 are employed to block off the feedback action of inverter 84 when it is desirable to change the state stored in the latch. Otherwise, overcoming the feedback action of inverter 84 could create undue delay.

Basic cells 40 in accordance with the embodiment of FIG. 2, however, can be employed to produce a latch circuit with the functionality of the circuit of FIG. 3, but without a transmission gate like gate 78. This is made possible by the presence of both long channel and wide channel transistors in the basic cells 40. By employing long channel transistors in the feedback loop, the strength of the feedback is much reduced. As a result, it is much easier for the driving buffer, which is formed using a wide channel transistor, to overcome the feedback action. Thus, extra transmission gates can be avoided.

FIG. 4A is a schematic circuit diagram of the latch circuit 100 produced using basic cells 40 in accordance with the present invention. The latch circuit of FIG. 4A achieves the functionality of the circuit of FIG. 3 without the need to employ the transmission gate 78, inverters 80, and the P-channel transistor in transmission gate 76. In order that these changes may be made without penalty, inverter 102 is composed of long channel transistors having a drive capability much weaker than the transistors in inverter 82. Thus, for the purpose of illustration, assume again that inverters 82 and 102 together store the logic state "1" at node A. In that logic state, transistor 104 is turned off by clock signal CK at the low logic state. The "1" logic state is maintained by the feedback action of inverter 102. When it is desirable to change the state stored in an inverter in accordance with the input signal at input node 86, the clock signal CK goes high, so that an input signal of "1" at input node 86 node would force node A low. Since the P-channel and N-channel transistors in inverter 102 are now long channel transistors, they have relatively weak drive capability, so that it is easier for buffer 72 to overcome the action of inverter 102. Once node A is forced to fall to certain value below the threshold of the transistors in inverter 82, the output of inverter 82 will begin to change state, thereby also forcing the output of inverter 102 to also change state. Since the transistors in inverter 82 have much higher drive capability than those in inverter 102, such changing of the state at node A can be accomplished quickly. In the preferred embodiment, the ratio of channel width to channel length of the wide channel transistors used in inverter 82 is preferable greater than thirty times the ratio of channel width to channel length of the long channel transistors in inverter 102. It will be noted that the input of output buffer 74 is taken from node A instead of at the output of inverter 82. This has the advantage that the output signal at node 88 will follow the input signal at 86 without any reversing of polarity. This is also advantageous since the output signal at node 88 will not be delayed by the transistors of inverter 82.

The illustrative layout plot of FIG. 4B shows the interconnection of long channel and wide channel transistors of adjacent basic cells 40 to implement the latch circuit of FIG. 4A. Lower drive long channel transistors are used to implement the inverter 102, and higher drive wide channel transistors are used to implement the inverters 72, 74 and 82. The P+ guard region in the NMOS column is connected to ground potential, and the N+ guard layer in the PMOS column is connected to VDD.

A common problem in integrated circuit design is ESD (electrostatic discharge). Such discharge can cause severe damage to the integrated circuit and circuit designers must take ESD into account in their design. FIGS. 5–7 illustrate circuits in which basic cells 18 like that of FIG. 1 can be used to avoid the harmful effects of ESD. FIG. 5A is a schematic circuit diagram of an input pad 150, an input buffer 152, a resistor 154 and a CMOS implementation of big discharge transistors 160, to illustrate the preferred embodiment of the invention. As shown in FIG. 5A, input pad 150 is connected to input buffer 152 through a silicide resistor 154. The node 176 between resistor 154 and buffer 152 is connected in parallel to a number of large discharge transistors 160 which are turned off by connection to transistors 162 and 164. If electrostatic charge builds up to a high voltage at input pad 150, such high voltage will cause transistors 160 to conduct as known to those skilled in the art so that the charge will be dissipated through these transistors to the power or ground planes 166 which are normally provided in semiconductor packages. Input buffer 152 includes transistors 168. The transistors 160, 162, 164, and 168 can be implemented using basic cells 18 such as that shown in FIG. 1, for example. These transistors are connected by means of a metal layer to form buffer 152 and to interconnect transistors 160, 162, 164 and to connect the big discharge transistors, buffer 152, silicide resistor 154, and input at 150. FIG. 7 is a partly cross-sectional and partly schematic view of a semiconductor die to illustrate the connections between pad 150, resistor 154, and the input buffer 152. As shown in FIG. 7, pad 150 is connected through a via 170 to a metal. layer 172 which in turn is connected through a contact 174 to the silicide layer 154 that forms the resistor. Silicide layer 154 is in turn connected through a metal layer (shown schematically as aligned) 176 to the gate of transistors 168. Thus, in actual implementation, the silicide layer 154 is separated from the field oxide by a silicon oxide layer (not shown). The method for implementing the structure of FIG. 7 is illustrated below in reference to the flow chart of FIG. 11. The gates of transistors 168 are typically made of polysilicon.

FIG. 5B is an illustrative layout plot showing the interconnection of a respective basic cell 18 to form the input circuit of FIG. 5A. The smaller long channel transistors are used to implement control transistors 162 and 164. The larger wide channel transistors are used to implement the parallel connected discharge transistors.

FIG. 5C shows an illustrative diode used to represent the discharge action of the parallel connected NMOS transistors. There is a diode action between the P-type substrate and the N+ source/drain regions. Normally, the diode is reverse biased because node 176 usually has a potential between 0–5 volts. However, if the node 176 falls below 0 volts then the diode becomes forward biased and conducts, thereby protecting against negative surge ESD damage.

FIG. 5D shows an illustrative diode used to represent the discharge action of the parallel connected PMOS transistors. There is a diode action between the P+ source/drain regions and the N-well. Normally, the diode is reverse biased because node 176 usually has a potential between 0–5 volts. However, if the node 176 rises sufficiently above VDD then the diode becomes forward biased and conducts, thereby protecting against positive surge ESD damage.

FIG. 6 is a schematic circuit diagram illustrating the ESD scheme for an output pad. Again, the output pad is connected to the output buffer 200 through a silicide resistor 154 where the node between the resistor and the output buffer is connected by the metal interconnect to a number of parallel big discharge transistors which are normally turned off. In the event there is no ESD, the discharge transistors of FIGS. 5 and 6 do not affect the functions of the input and output pads and the input and output buffers except by adding parasitic capacitance and a slight RC delay due to the combined effect of the parasitic capacitance and the silicide resistor. During ESD, however, these big discharge transistors become conducting due to effects such as punch through, which would effectively discharge the high voltage static buildup at the input or output pad.

It will be appreciated that the output circuit of FIG. 6 can be implemented using basic cells in accordance with the present invention. The large discharge transistors can be implemented using wide channel transistors. The control transistors can be implemented using long channel transistors. The implementation of the output circuit will be understood by those skilled in the art from the discussion above and need not be set forth herein.

To reduce the effect of stray carriers or the input or output buffers and the discharge transistors, guard rings are fabricated using the guard regions 45 and 47 of FIG. 1 and the guard regions 51 and 53 of FIG. 2 which are connected together by a metal layer interconnect layer (not shown) implemented using a CAD tool.

The method of this invention is illustrated in FIGS. 8–11. FIG. 8 is a schematic diagram of a semiconductor wafer on which is fabricated the sea-of-gate structures 40 of FIG. 2. The lithography for semiconductor processing sets an outer maximum limit for the size of an area that can be processed at time. The maximum area of the wafer which may be processed at one time due to the limitations of lithography is known as a frame. Ideally, the frame is as large as the wafer. FIG. 8 is a schematic diagram of a wafer 300 larger than the frames 302 as shown in FIG. 8. Each frame 302 may be subdivided into of the desired size. However, before the wafer 300 is scribed into such, it is efficient to use a CAD tool to implement metal interconnects and to define the I/o cells, such as in the manner described above in reference to FIGS. 5–7. Such metal I/O partitions are shown conceptually by the dotted lines 304 in FIG. 8. After the metallization and the use of other interconnect means, wafer 300 may be scribed into the respective. While theoretically each frame 302 may be scribed into any combination of the same or different sizes, the die sawing equipment available typically can only be used to scribe each frame 302 into a number of identical size. Thus, as illustrated in FIG. 8, each frame 302 will be scribed into ten. In FIG. 9, each frame 312 will be scribed into fifteen instead.

FIG. 10 is a flow chart illustrating the conventional method for fabricating gate array type circuits. As explained above, presently, an inventory of different array size is kept by ASIC manufacturer would first determine the different array sizes of that should be kept in inventory. For each die size, a mask set must be prepared, including the well mask, island mask, polysilicon mask, and P-Channel and N-channel masks for a CMOS implementation. Thus, as shown in FIG. 10, the number of mask set is determined (block 400). Assume, for example,that n different size are to be kept in inventory so that n mask sets must be prepared. Therefore, to fabricate the ith size diet the well mask, island, polysilicon mask, P-channel mask, and N-channel mask (for CMOS implementation) are used sequentially to fabricate the i die (blocks 402–410). After the n are fabricated insufficient quantities, are then stored and form the inventory. When a customer's orders are received, the appropriate array size die is selected from inventory having a gate count equal to or greater than that called for by the customer's design (block 412). Such selected size die is then processed by forming a contact, a first metal layer, a metal via, a second metal layer, in order to interconnect the transistors of the (blocks 414–420). Then die is packaged and shipped as prototype (blocks 422, 424). In other words, by using the conventional method for fabricating gate array circuits, a manufacturer must an inventory of different size. Furthermore, due to the wide range of gate counts called for by customers, either a large number of different size must be kept in inventory, or a large number of gates may be wasted if the right size die in inventory called for actually contains many more gates than is actually used in the customer's design. This is.

FIG. 11 is a flow chart illustrating the method of this invention. Since the die or wafer may be scribed at a later time to fit the gate count required by the customer, only one size need be maintained in the inventory. Preferably, the die is at least as large as any that may desire. The die wafer is then processed to form the diffusion and polysilicon regions in a manner similar to that described above in referenced to FIG. 10. Then the proper array size is selected to fit the gate count called for by a customer's design. The CAD tool is then used to implement vias, and interconnects to thereby interconnect the transistors and to define the I/O partitions for such array size. In the preferred embodiment, s-vias are first formed, followed by the deposition of the metal silicide layer as interconnect layer (blocks 502, 504). Contacts are then formed followed by the formation of a metal first layer (blocks 506, 508). Metal vias are formed followed by another metal layer, if desired. If so desired, additional metal vias and metal layers may be implemented as well. After the I/O metal partition at the interconnects have been completed, the die wafer undergoes a die saw operation so as to scribe each wafer or die into smaller of the appropriate size. The smaller die is then packaged and shipped as prototypes (blocks 516, 518).

While the application has been described above by reference to various embodiments, it will be understood that different changes may be made without departing from the scope of the invention which is to be limited only by the claims.

WHAT is claimed is:

1. A master-slice gate array integrated circuit device comprising;
   a semiconductor medium; and
   an array of basic transistors in the medium forming sea-of-gate structures, wherein said sea-of-gate structures each comprises a plurality of wide channel transistors whose channel length is less than channel width and at least one pair of long channel transistors whose channel length is at least four times greater than its channel width.

2. The circuit of claim 1, wherein the basic transistors of said array are defined by reference to routing grids or tracks, and wherein said pair of long channel transistors occupies one routing grid or track.

3. The circuit of claim 2, wherein said long channel transistors each has a source, a drain and a gate, and wherein the source, drain and gate of each of the long channel transistors are on said one routing grid or track.

4. The circuit of claim 1, wherein each transistor has a ratio of channel width to channel length; and
   wherein the ratio of each wide channel transistor is greater than 30 times the ratio of each long channel transistor.

5. The circuit of claim 1, further comprising:
   at least one conducting layer connecting at least one of the wide channel transistors and at least one of the long channel transistors to form a memory cell, said memory cell including:
   a first inverter comprising the at least one wide channel transistor; and
   a second inverter comprising the at least one long channel transistor;
   said first and second inverters each having an input and an output
   the input of the second inverter being connected to the output of the first inverter, and the output of the second inverter being connected to the input of the first inverter.

6. The circuit of claim 5, wherein said at least one conducting layer connects the at least one wide channel transistor and the at least one long channel transistor to form a latch, said latch comprising:
   said memory cell;
   a gate controlled by a clock signal;
   an input buffer having an output;
   the output of the input buffer being connected to the input of the first inverter of said memory cell through said gate.

7. The circuit of claim 6, said latch further comprising an output buffer having an input;
   wherein the input of the output buffer is connected to the input of the first inverter.

8. The circuit of claim 7, wherein said input and output buffers each comprise two transistors.

9. The circuit of claim 5, wherein the basic transistors of said array are defined by reference to grids or tracks, said second inverter occupying only one track or grid.

10. A master-slice gate array integrated circuit comprising:
    a semiconductor substrate;
    a multiplicity of basic cells formed on the substrate, each basic cell including at least one long channel transistor and a plurality of wide channel transistors;
    wherein the channel length of each at least one long channel transistor is greater than its channel width; and
    wherein the channel width of each wide channel transistor is greater than its channel length.

11. The circuit according to claim 10,
    wherein each respective basic cell includes common source/drain regions that are shared by adjacent wide channel transistors.

12. The circuit of claim 10,
    wherein each respective basic cell includes a respective column of n-type wide channel transistors in which adjacent n-type wide channel transistors share common source/drain regions;
    wherein each respective basic cell includes a respective column of p-type wide channel transistors in which adjacent p-type wide channel transistors share common source/drain regions.

13. The circuit of claim 10,
    wherein each respective basic cell includes a respective column of n-type wide channel transistors in which adjacent n-type wide channel transistors share common source/drain regions;

wherein each respective basic cell includes a respective column of p-type wide channel transistors in which adjacent p-type wide channel transistors share common source/drain regions; and wherein for respective basic cells, n-type transistor columns and respective p-type transistor columns are disposed side by side.

14. The circuit of claim 10, wherein each respective basic cell includes at least one n-type long channel transistor and at least one p-type long channel transistor; and wherein for respective basic cells, respective n-type long channel transistors and respective p-type long channel transistors are disposed side by side.

15. A master-slice gate array circuit comprising:

a semiconductor substrate;

a multiplicity of basic cells formed on the substrate, each basic cell including at least one long channel transistor and a plurality of wide channel transistors;

wherein the channel length of each at least one long channel transistor is greater than its channel width; and wherein the channel width of each wide channel transistor is greater than its channel length;

wherein each respective basic cell includes a respective column of n-type wide channel transistors in which adjacent n-type wide transistors channel share common source/drain regions, a respective column of p-type wide channel transistors in which adjacent p-type wide channel transistors share common source/drain regions, at least one n-type long channel transistor and at least one p-type long channel transistor;

wherein horizontal and vertical grid lines form a coordinate system used for placing and routing interconnect lines; and wherein for each respective basic cell, source/drains of respective n-type wide channel transistors and source/drains of respective p-type wide channel transistors share respective first horizontal grid lines and respective n-type long channel transistors and respective p-type long channel transistors share respective second horizontal grid lines.

16. The circuit of claim 15, wherein, for each respective basic cell, source/drains of respective n-type wide channel transistors and source/drains of respective p-type wide channel transistors that share respective first horizontal grid lines are crossed by multiple vertical grid lines and source/drains of respective n-type long channel transistors and source/drains of respective p-type long channel transistors that share respective first horizontal grid lines are crossed by multiple vertical grid lines.

17. The circuit of claim 15, wherein respective basic cells are aligned such that source/drains of respective n-type wide channel transistors of such aligned basic cells and source/drains of respective p-type wide channel transistors of such aligned basic cells share respective first horizontal grid lines and such that respective n-type long channel transistors of such aligned basic cells and respective p-type long channel transistors of such aligned basic cells share respective second horizontal grid lines.

18. The circuit of claim 17, wherein for each respective basic cell, respective wide channel transistors and respective long channel transistors are each crossed by multiple vertical grid lines.

19. The circuit of claim 10, wherein horizontal and vertical grid lines form a coordinate system used for placing and routing interconnect lines;

wherein respective basic cells are disposed adjacent to each other such that respective wide channel transistors of such adjacent basic cells share respective first horizontal lines; and wherein transistors that share such respective first horizontal lines are crossed by multiple vertical lines.

20. The circuit of claim 10, wherein for each respective basic cell, respective channels of the long channel transistors are substantially orthogonal to respective channels of respective wide channel transistors.

21. The circuit of claim 10, wherein respective current flow paths of respective long channel transistors are substantially orthogonal to respective current flow paths of respective wide channel transistors.

22. The circuit of claim 10, wherein the substrate is a p-type substrate and respective basic cells have respective n-type wells and respective p-type transistors are formed in such n-type wells.

23. The circuit of claim 10 and further including:

guard regions formed on the substrate between respective basic cells.

* * * * *